United States Patent
Nakayama et al.

(10) Patent No.: US 10,101,380 B2
(45) Date of Patent: Oct. 16, 2018

(54) DEVICE FOR DETERMINING ELECTRICAL WIRE BUNDLE

(71) Applicant: Mitsubishi Aircraft Corporation, Aichi (JP)

(72) Inventors: Yoshihiro Nakayama, Tokyo (JP); Koji Toyama, Tokyo (JP)

(73) Assignee: MITSUBISHI AIRCRAFT CORPORATION, Aichi (JP)

( * ) Notice: Subject to any disclaimer, the term of this patent is extended or adjusted under 35 U.S.C. 154(b) by 255 days.

(21) Appl. No.: 15/045,746

(22) Filed: Feb. 17, 2016

(65) Prior Publication Data

US 2016/0274165 A1    Sep. 22, 2016

(30) Foreign Application Priority Data

Mar. 19, 2015    (JP) .................................. 2015-056009

(51) Int. Cl.
*G01R 31/02*    (2006.01)
*H01B 7/00*    (2006.01)
*G01R 31/00*    (2006.01)

(52) U.S. Cl.
CPC .......... *G01R 31/023* (2013.01); *G01R 31/001* (2013.01)

(58) Field of Classification Search
CPC .. G01R 31/001; G01R 31/023; G01R 31/043; G01R 31/041; G01R 31/02; G01R 31/04
See application file for complete search history.

(56) References Cited

U.S. PATENT DOCUMENTS

| 4,985,313 | A | * | 1/1991 | Penneck | C23C 28/00 428/627 |
| 5,153,839 | A | * | 10/1992 | Cross | G05B 19/41835 29/33 M |
| 9,250,283 | B2 | * | 2/2016 | Johnson | G01R 31/11 |
| 2003/0141878 | A1 | * | 7/2003 | Shinzou | G01R 31/023 324/539 |
| 2007/0050178 | A1 | * | 3/2007 | Linzey | G06Q 10/04 703/2 |
| 2009/0167287 | A1 | * | 7/2009 | Van Meijl | G01R 31/023 324/66 |
| 2014/0088919 | A1 | | 3/2014 | Toyama et al. | |
| 2014/0218046 | A1 | | 8/2014 | Nakayama et al. | |
| 2014/0297207 | A1 | | 10/2014 | Toyama et al. | |

FOREIGN PATENT DOCUMENTS

| JP | 5182973 A | 4/2013 |
| JP | 2014-061841 A | 4/2014 |
| JP | 2014-194676 A | 10/2014 |

* cited by examiner

*Primary Examiner* — Seahvosh Nikmanesh
(74) *Attorney, Agent, or Firm* — Pearne & Gordon LLP

(57) ABSTRACT

A device for determining an electrical wire bundle, in which, when the electrical wire bundle includes even one test electrical wire which conducts electricity to a terminal device, the electrical wire bundle is given an A-rating indicating an electrical wire bundle to be used for a test; when the electrical wire bundle includes at least one electrical wire which conducts electricity to the terminal device but is not the test electrical wire, the electrical wire bundle is given a B-rating indicating that the electrical wire bundle is not allowed to be disconnected; and when the electrical wire bundle includes only electrical wires that do not conduct electricity to the terminal device, the electrical wire bundle is given a C-rating indicating an electrical wire bundle not to be used for the test.

20 Claims, 24 Drawing Sheets

FIG. 3A

| CONNECTION INFORMATION | | | MATING CONNECTORS:C7&C1 | | | |
|---|---|---|---|---|---|---|
| No | ITEM-1 | | ITEM-2 | | | |
| | CONNECTOR ID | PIN ID | CONNECTOR ID | PIN ID | CATEGORY | OVERALL RATING |
| 1 | C7 | P1 | C1 | J1 | | |
| 2 | | P3 | | J3 | | |
| 3 | | P5 | | J5 | | |
| 4 | | P7 | | J7 | | |
| 5 | | P8 | | J8 | | |
| 6 | | P9 | | J9 | | |

FIG. 3B

| CONNECTION INFORMATION | | | MATING CONNECTORS:C3&C4 | | | |
|---|---|---|---|---|---|---|
| No | ITEM-1 | | ITEM-2 | | | |
| | CONNECTOR ID | PIN ID | CONNECTOR ID | PIN ID | CATEGORY | OVERALL RATING |
| 1 | C3 | J2 | C4 | P2 | | |
| 2 | | J4 | | P4 | | |
| 3 | | J6 | | P6 | | |
| 4 | | J8 | | P8 | | |
| 5 | C9 | P1 | ... | ... | | |
| 6 | | P3 | ... | ... | | |
| 7 | | P5 | ... | ... | | |
| 8 | C2 | P7 | ... | ... | | |
| 9 | | P9 | ... | ... | | |

FIG. 3C

| CONNECTION INFORMATION | | | MATING CONNECTORS:C5&C8 | | |
|---|---|---|---|---|---|
| No | ITEM-1 | | ITEM-2 | | |
| | CONNECTOR ID | PIN ID | CONNECTOR ID | PIN ID | CATEGORY |
| 1 | C5 | J1 | C8 | P1 | |
| 2 | | J3 | | P3 | |
| 3 | | J5 | | P5 | |
| 4 | | J6 | | P6 | |

FIG. 3D

| CONNECTION INFORMATION | | | | | HARNESS ID:WH1 | | |
|---|---|---|---|---|---|---|---|
| No | ITEM-1 | | ELECTRICAL WIRE | | | ITEM-2 | OVERALL RATING |
| | CONNECTOR ID | PIN ID | ELECTRICAL WIRE ID | CATEGORY | CONNECTOR ID | PIN ID | |
| 1 | C1 | J1 | W12 | | C3 | J2 | |
| 2 | | J3 | W14 | | | J4 | |
| 3 | | J5 | W16 | | | J6 | |
| 4 | | J7 | W18 | | | J8 | |
| 5 | | J1 | W11 | | C9 | P1 | |
| 6 | | J3 | W13 | | | P3 | |
| 7 | | J5 | W15 | | | P5 | |
| 8 | | J8 | W17 | | C2 | P7 | |
| 9 | | J9 | W19 | | | P9 | |

FIG. 3E

| CONNECTION INFORMATION | | | | | HARNESS ID:WH2 | | |
|---|---|---|---|---|---|---|---|
| No | ITEM-1 | | ELECTRICAL WIRE | | | ITEM-2 | OVERALL RATING |
| | CONNECTOR ID | PIN ID | ELECTRICAL WIRE ID | CATEGORY | CONNECTOR ID | PIN ID | |
| 1 | C10 | P1 | W27 | | C0 | P3 | |
| 2 | | P4 | W28 | | | P5 | |
| 3 | C4 | P2 | W21 | | C5 | J1 | |
| 4 | | P4 | W22 | | | J3 | |
| 5 | | P6 | W23 | | | J5 | |
| 6 | | P8 | W24 | | | J6 | |
| 7 | | P8 | W25 | | C6 | J2 | |
| 8 | | P4 | W26 | | | J4 | |

FIG. 4A

| INPUT TABLE | |
|---|---|
| CONNECTOR ID | PIN ID |
| C7 | P1 |
| C7 | P5 |

FIG. 4B

| HARNESS ID | WH1 | | | WH2 | | |
|---|---|---|---|---|---|---|
| | NECESSARY CONNECTOR | UNNECESSARY (CONDUCTING) | UNNECESSARY (NON-CONDUCTING) | NECESSARY CONNECTOR | UNNECESSARY (CONDUCTING) | UNNECESSARY (NON-CONDUCTING) |
| OVERALL RATING | A | B | C | A | B | C |
| CONNECTOR NUMBER | C1 C3 C9 | C2 | | C4 C5 | C6 | C8 C10 |

FIG. 6A

| CONNECTION INFORMATION | | | MATING CONNECTORS: C7&C1 | | | |
|---|---|---|---|---|---|---|
| No | ITEM-1 | | ITEM-2 | | | |
| | CONNECTOR ID | PIN ID | CONNECTOR ID | PIN ID | CATEGORY | OVERALL RATING |
| 1 | C7 | P1 | C1 | J1 | c | |
| 2 | | P3 | | J3 | c | |
| 3 | | P5 | | J5 | c | |
| 4 | | P7 | | J7 | c | |
| 5 | | P8 | | J8 | c | |
| 6 | | P9 | | J9 | c | |

FIG. 6B

| CONNECTION INFORMATION | | | MATING CONNECTORS: C3&C4 | | | |
|---|---|---|---|---|---|---|
| No | ITEM-1 | | ITEM-2 | | | |
| | CONNECTOR ID | PIN ID | CONNECTOR ID | PIN ID | CATEGORY | OVERALL RATING |
| 1 | C3 | J2 | C4 | P2 | c | |
| 2 | | J4 | | P4 | c | |
| 3 | | J6 | | P6 | c | |
| 4 | | J8 | | P8 | c | |
| 5 | C9 | P1 | ... | ... | c | |
| 6 | | P3 | | ... | c | |
| 7 | | P5 | | ... | c | |
| 8 | C2 | P7 | ... | ... | c | |
| 9 | | P9 | | ... | c | |

FIG. 6C

| CONNECTION INFORMATION | | | MATING CONNECTORS: C5&C8 | | |
|---|---|---|---|---|---|
| No | ITEM-1 | | ITEM-2 | | |
| | CONNECTOR ID | PIN ID | CONNECTOR ID | PIN ID | CATEGORY |
| 1 | C5 | J1 | C8 | P1 | c |
| 2 | | J3 | | P3 | c |
| 3 | | J5 | | P5 | c |
| 4 | | J6 | | P6 | c |

FIG. 6D

CONNECTION INFORMATION — HARNESS ID:WH1

| No | ITEM-1 CONNECTOR ID | PIN ID | ELECTRICAL WIRE ID | ELECTRICAL WIRE CATEGORY | ITEM-2 CONNECTOR ID | PIN ID | OVERALL RATING |
|---|---|---|---|---|---|---|---|
| 1 | C1 | J1 | W12 | c | C3 | J2 | |
| 2 | | J3 | W14 | c | | J4 | |
| 3 | | J5 | W16 | c | | J6 | |
| 4 | | J7 | W18 | c | | J8 | |
| 5 | | J1 | W11 | c | C9 | P1 | |
| 6 | | J3 | W13 | c | | P3 | |
| 7 | | J5 | W15 | c | | P5 | |
| 8 | | J8 | W17 | c | C2 | P7 | |
| 9 | | J9 | W19 | c | | P9 | |

FIG. 6E

CONNECTION INFORMATION — HARNESS ID:WH2

| No | ITEM-1 CONNECTOR ID | PIN ID | ELECTRICAL WIRE ID | ELECTRICAL WIRE CATEGORY | ITEM-2 CONNECTOR ID | PIN ID | OVERALL RATING |
|---|---|---|---|---|---|---|---|
| 1 | C10 | P1 | W27 | c | C0 | P3 | |
| 2 | | P4 | W28 | c | | P5 | |
| 3 | C4 | P2 | W21 | c | C5 | J1 | |
| 4 | | P4 | W22 | c | | J3 | |
| 5 | | P6 | W23 | c | | J5 | |
| 6 | | P8 | W24 | c | | J6 | |
| 7 | | P8 | W25 | c | C6 | J2 | |
| 8 | | P4 | W26 | c | | J4 | |

FIG. 8A

| INPUT TABLE | |
|---|---|
| CONNECTOR ID | PIN ID |
| C7 | P1 |
| C7 | P5 |

| CONNECTION INFORMATION | | | MATING CONNECTORS: C7&C1 | | | |
|---|---|---|---|---|---|---|
| No | ITEM-1 | | ITEM-2 | | | |
| | CONNECTOR ID | PIN ID | CONNECTOR ID | PIN ID | CATEGORY | OVERALL RATING |
| 1 | C7 | P1 | C1 | J1 | a | A |
| 2 | | P3 | | J3 | c | |
| 3 | | P5 | | J5 | a | |
| 4 | | P7 | | J7 | c | |
| 5 | | P8 | | J8 | c | |
| 6 | | P9 | | J9 | c | |

FIG. 8B

| CONNECTION INFORMATION | | | MATING CONNECTORS: C3&C4 | | | |
|---|---|---|---|---|---|---|
| No | ITEM-1 | | ITEM-2 | | | |
| | CONNECTOR ID | PIN ID | CONNECTOR ID | PIN ID | CATEGORY | OVERALL RATING |
| 1 | C3 | J2 | C4 | P2 | c | |
| 2 | | J4 | | P4 | c | |
| 3 | | J6 | | P6 | c | |
| 4 | | J8 | | P8 | c | |
| 5 | C9 | P1 | ... | ... | c | |
| 6 | | P3 | | ... | c | |
| 7 | | P5 | | ... | c | |
| 8 | C2 | P7 | ... | ... | c | |
| 9 | | P9 | | ... | c | |

FIG. 8C

| CONNECTION INFORMATION | | | MATING CONNECTORS: C5&C8 | | |
|---|---|---|---|---|---|
| No | ITEM-1 | | ITEM-2 | | |
| | CONNECTOR ID | PIN ID | CONNECTOR ID | PIN ID | CATEGORY |
| 1 | C5 | J1 | C8 | P1 | c |
| 2 | | J3 | | P3 | c |
| 3 | | J5 | | P5 | c |
| 4 | | J6 | | P6 | c |

FIG. 10A

| INPUT TABLE | |
|---|---|
| CONNECTOR ID | PIN ID |
| C7 | P1 |
| C7 | P5 |

| CONNECTION INFORMATION | | | MATING CONNECTORS: C7&C1 | | | |
|---|---|---|---|---|---|---|
| No | ITEM-1 | | ITEM-2 | | | |
| | CONNECTOR ID | PIN ID | CONNECTOR ID | PIN ID | CATEGORY | OVERALL RATING |
| 1 | C7 | P1 | C1 | J1 | a | A |
| 2 | | P3 | | J3 | b | |
| 3 | | P5 | | J5 | a | |
| 4 | | P7 | | J7 | b | |
| 5 | | P8 | | J8 | b | |
| 6 | | P9 | | J9 | b | |

FIG. 10B

| CONNECTION INFORMATION | | | MATING CONNECTORS: C3&C4 | | | |
|---|---|---|---|---|---|---|
| No | ITEM-1 | | ITEM-2 | | | |
| | CONNECTOR ID | PIN ID | CONNECTOR ID | PIN ID | CATEGORY | OVERALL RATING |
| 1 | C3 | J2 | C4 | P2 | a | A |
| 2 | | J4 | | P4 | b | |
| 3 | | J6 | | P6 | a | |
| 4 | | J8 | | P8 | b | |
| 5 | C9 | P1 | ... | ... | ... | ... |
| 6 | | P3 | | ... | ... | |
| 7 | | P5 | | ... | ... | |
| 8 | C2 | P7 | ... | ... | ... | |
| 9 | | P9 | | ... | ... | |

FIG. 10C

| CONNECTION INFORMATION | | | MATING CONNECTORS: C5&C8 | | |
|---|---|---|---|---|---|
| No | ITEM-1 | | ITEM-2 | | |
| | CONNECTOR ID | PIN ID | CONNECTOR ID | PIN ID | CATEGORY |
| 1 | C5 | J1 | C8 | P1 | a |
| 2 | | J3 | | P3 | b |
| 3 | | J5 | | P5 | a |
| 4 | | J6 | | P6 | b |

FIG. 12A

| INPUT TABLE | |
|---|---|
| CONNECTOR ID | PIN ID |
| C7 | P1 |
| C7 | P5 |

| CONNECTION INFORMATION | | | MATING CONNECTORS: C7&C1 | | | |
|---|---|---|---|---|---|---|
| No | ITEM-1 | | ITEM-2 | | | |
| | CONNECTOR ID | PIN ID | CONNECTOR ID | PIN ID | CATEGORY | OVERALL RATING |
| 1 | C7 | P1 | C1 | J1 | a | A |
| 2 | | P3 | | J3 | b | |
| 3 | | P5 | | J5 | a | |
| 4 | | P7 | | J7 | b | |
| 5 | | P8 | | J8 | b | |
| 6 | | P9 | | J9 | b | |

FIG. 12B

| CONNECTION INFORMATION | | | MATING CONNECTORS: C3&C4 | | | |
|---|---|---|---|---|---|---|
| No | ITEM-1 | | ITEM-2 | | | |
| | CONNECTOR ID | PIN ID | CONNECTOR ID | PIN ID | CATEGORY | OVERALL RATING |
| 1 | C3 | J2 | C4 | P2 | a | A |
| 2 | | J4 | | P4 | b | |
| 3 | | J6 | | P6 | a | |
| 4 | | J8 | | P8 | b | |
| 5 | C9 | P1 | ... | ... | ... | ... |
| 6 | | P3 | ... | ... | ... | |
| 7 | | P5 | ... | ... | ... | |
| 8 | C2 | P7 | ... | ... | ... | |
| 9 | | P9 | ... | ... | ... | |

FIG. 12C

| CONNECTION INFORMATION | | | MATING CONNECTORS: C5&C8 | | | |
|---|---|---|---|---|---|---|
| No | ITEM-1 | | ITEM-2 | | | |
| | CONNECTOR ID | PIN ID | CONNECTOR ID | PIN ID | CATEGORY | |
| 1 | C5 | J1 | C8 | P1 | a | |
| 2 | | J3 | | P3 | b | |
| 3 | | J5 | | P5 | a | |
| 4 | | J6 | | P6 | b | |

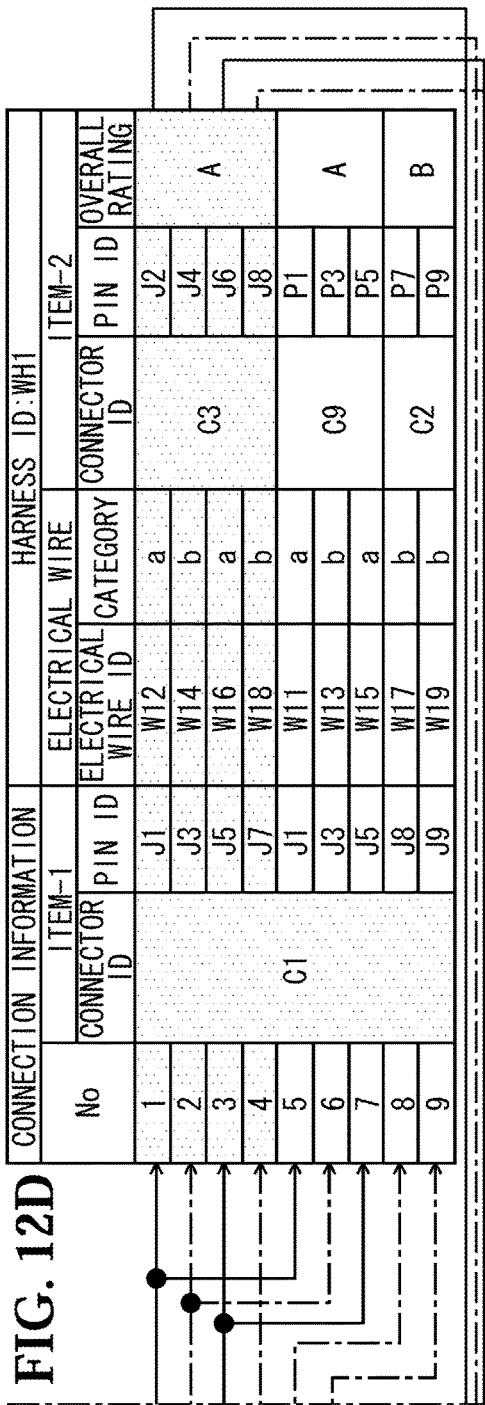
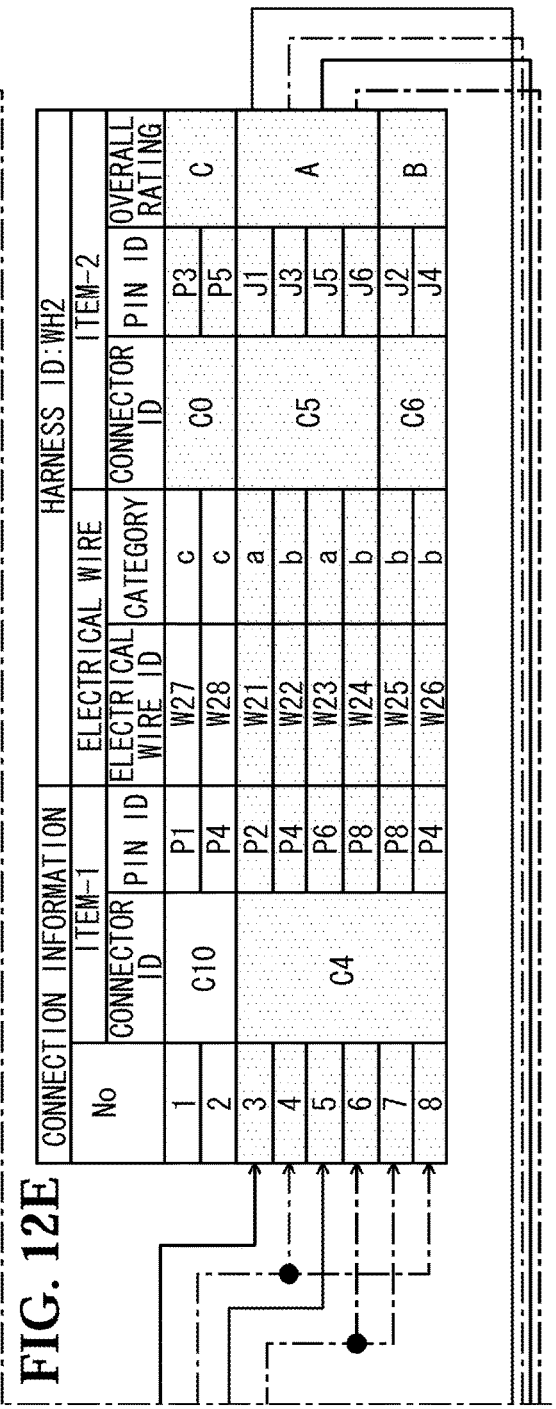

a: WIRES WHICH CONDUCT ELECTRICITY TO EQUIPMENT AND ARE TO BE USED FOR TEST
b: WIRES WHICH CONDUCT ELECTRICITY TO EQUIPMENT BUT ARE NOT TO BE USED FOR TEST
c: WIRES WHICH DO NOT CONDUCT ELECTRICITY TO EQUIPMENT AND ARE NOT TO BE USED FOR TEST

FIG. 15A

| INPUT TABLE | |
|---|---|
| CONNECTOR ID | PIN ID |
| C7 | P1 |
| C7 | P5 |

FIG. 15B

| HARNESS ID | WH1 | | | WH2 | | |
|---|---|---|---|---|---|---|
| | NECESSARY CONNECTOR | UNNECESSARY (CONDUCTING) | UNNECESSARY (NON-CONDUCTING) | NECESSARY CONNECTOR | UNNECESSARY (CONDUCTING) | UNNECESSARY (NON-CONDUCTING) |
| OVERALL RATING | A | B | C | A | B | C |
| CONNECTOR NUMBER | C1 C3 C9 | | C2 | C4 C5 | | C0 C10 C6 |

FIG. 16A

| INPUT TABLE | |
|---|---|
| CONNECTOR ID | PIN ID |
| C7 | P1 |
| C7 | P5 |

| CONNECTION INFORMATION | | | MATING CONNECTORS: C7&C1 | | | |
|---|---|---|---|---|---|---|
| No | ITEM-1 | | ITEM-2 | | | |
| | CONNECTOR ID | PIN ID | CONNECTOR ID | PIN ID | CATEGORY | OVERALL RATING |
| 1 | C7 | P1 | C1 | J1 | a | A |
| 2 | | P3 | | J3 | c | |
| 3 | | P5 | | J5 | a | |
| 4 | | P7 | | J7 | c | |
| 5 | | P8 | | J8 | c | |
| 6 | | P9 | | J9 | c | |

FIG. 16B

| CONNECTION INFORMATION | | | MATING CONNECTORS: C3&C4 | | | |
|---|---|---|---|---|---|---|
| No | ITEM-1 | | ITEM-2 | | | |
| | CONNECTOR ID | PIN ID | CONNECTOR ID | PIN ID | CATEGORY | OVERALL RATING |
| 1 | C3 | J2 | C4 | P2 | a | A |
| 2 | | J4 | | P4 | c | |
| 3 | | J6 | | P6 | a | |
| 4 | | J8 | | P8 | c | |
| 5 | C9 | P1 | ... | ... | ... | ... |
| 6 | | P3 | ... | ... | ... | ... |
| 7 | | P5 | ... | ... | ... | ... |
| 8 | C2 | P7 | ... | ... | ... | ... |
| 9 | | P9 | ... | ... | ... | ... |

FIG. 16C

| CONNECTION INFORMATION | | | MATING CONNECTORS: C5&C8 | | |
|---|---|---|---|---|---|
| No | ITEM-1 | | ITEM-2 | | |
| | CONNECTOR ID | PIN ID | CONNECTOR ID | PIN ID | CATEGORY |
| 1 | C5 | J1 | C8 | P1 | a |
| 2 | | J3 | | P3 | c |
| 3 | | J5 | | P5 | a |
| 4 | | J6 | | P6 | c |

DEVICE FOR DETERMINING ELECTRICAL WIRE BUNDLE

BACKGROUND OF THE INVENTION

Field of the Invention

The present invention relates to a device which determines which electrical wire bundle is to be used for an electrical test when the test is performed using connection information on a large number of wires in which a plurality of electronic devices are interconnected via connectors through wire harnesses including electrical wires.

Description of the Related Art

A wiring system which is configured by interconnecting, for example, an input device, a control device, and an output device through a wire harness (hereinafter simply "harness") needs to be checked, after the system has been assembled, as to whether the electrical wires composing the harness are connected in a proper route. However, when the system has large numbers of harnesses (wires) and terminal devices, such as input devices, or relay devices, it is not easy to check the validity of the connection route from a wiring diagram spreading over multiple sheets, or to confirm the safety of the wiring.

Therefore, the present applicants have hitherto proposed the following systems: a wiring connection check system whereby persons other than the system designer can easily check a connection route by the unit of a single wire even when the wiring system is large (Japanese Patent No. 5182973); a system whereby those harnesses at risk of including a combination of electrical wires which are not allowed to fail at the same time and those harnesses at risk of impairing the safety if they fail at the same time are easily extracted (Japanese Patent Laid-Open No. 2014-61841); and a system whereby the safety of wiring can be qualitatively analyzed even when the wiring structure is complicated (Japanese Patent Laid-Open No. 2014-194676).

The techniques proposed in the above disclosures are based on a principle that information showing the connection of any complicated wiring can be summarized into information on either of the following (a) and (b):

(a) Connector and electrical wire
(b) Connector and terminal device or relay device To efficiently and concurrently check the operation of a large wiring system including a harness after the system has been designed, a common procedure is dividing the entire system into sub-systems and, after obtaining confirmation by a test in each sub-system, finally checking the operation by an actual machine test with all the wires assembled.

Especially when it is necessary to perform a test inside a limited closed space, tests by the unit of a sub-system are essential. Examples of the closed space referred to here include a thermostatic chamber when performing a temperature environmental test on the entire test device and a sound resonating chamber when performing an electromagnetic wave/lightning protection test.

While it is in principle possible to perform a sub-system test using an actual harness as is, due to restrictions on the space where the test is performed etc., devices other than those to be evaluated and unnecessary harnesses need to be excluded from the sub-system test.

The following are two possible plans for selecting only those harnesses that are necessary for a test.

Plan 1: Use as is an actual harness to be energized in a sub-system test, with branch cables which have no connection destination in the actual harness physically disconnected from their branch points or provided with a shield cap to prevent noise contamination at the connector of the terminal end of the branch. A prerequisite for physical disconnection is that no electrical wires are energized at the disconnection point. Since a multicore wire cannot be disconnected if even one electrical cable thereof is energized, a shield cap is provided.

Plan 1 is a preferable test form in that an actual machine is simulated since an actual harness is used as it is, but the test scale is large due to the inclusion of harnesses which are not directly involved in the test.

Plan 2: Redesign an actual harness to be energized in a sub-system test into a harness in which only those electrical wires that are to be energized in the test are left while all the unnecessary (non-conducting) electrical wires are removed, and use the redesigned harness as a test harness.

In Plan 2, the test scale is smaller since electrical wires unnecessary for the test are removed, but the test conditions are severer in that a lightning protection current flowing through each electrical wire becomes larger for the reduced number of the electrical wires since the lightning protection current flowing through the entire electrical wire bundle remains the same.

In both plans, it has been extremely difficult to find out which harnesses and electrical wires are necessary for a sub-system test by following the connection state in a huge number of harness drawings. Moreover, since the connection state of each of core wires composing a harness cannot be discerned by appearance as shown in FIG. 18, it is unclear which wire can be removed.

It is therefore an object of the present invention to provide a device which can determine, by the unit of an electrical wire bundle, which wire route is composed of electrical wires and connectors necessary for a test harness from design data about a wiring system employed in an actual machine.

SUMMARY OF THE INVENTION

Having been contrived to achieve the above object, the present invention is a device for determining an electrical wire bundle which determines which electrical wire bundle includes a test electrical wire to be used for an electrical test in a wiring structure interconnecting terminal devices through a plurality of wire harnesses each including a plurality of electrical wires composing an electrical wire bundle and connectors connected with the electrical wires, the device including: a storage unit which stores connection information about connection relations between the electrical wires and the connectors; and a processing unit which determines which electrical wire bundle includes the test electrical wire on the basis of the connection information stored in the storage unit.

When the electrical wire bundle includes even one test electrical wire which conducts electricity to the terminal device, the processing unit in the present invention gives the electrical wire bundle an A-rating which indicates an electrical wire bundle to be used for the test, and when the electrical wire bundle includes only the electrical wires that do not conduct electricity to the terminal device, the processing unit gives the electrical wire bundle a C-rating which indicates an electrical wire bundle not to be used for the test.

It is possible to accommodate the above-described Plan 2 by giving the A-rating and the C-rating.

When the electrical wire bundle includes at least one electrical wire which conducts electricity to the terminal device but is not the test electrical wire, the processing unit in the present invention can give the electrical wire bundle a B-rating which indicates that the electrical wire bundle is not allowed to be disconnected.

Thus, it is possible to accommodate the above-described Plan 1 by giving the B-rating in addition to the A-rating and the C-rating.

On the basis of identification information on pins of a test connector included in the terminal device used for the test, the processing unit in the present invention can link pieces of the connection information stored in the storage unit to one another, and give each of the linked electrical wires a category a which indicates that the electrical wire is the test electrical wire. Then, if the electrical wire bundle includes even one test electrical wire to which the category a is given, the processing unit can give the electrical wire bundle the A-rating.

On the basis of identification information on pins which are pins of a connector mated with the terminal device used for the test and other than the pins of the test connector, the processing unit in the present invention can link pieces of the connection information stored in the storage unit to one another, and give each of the linked electrical wires a category b which indicates that the electrical wire conducts electricity to the terminal device but is not the test electrical wire. Then, if the electrical wire bundle includes only the electrical wires to which the category b is given, the processing unit can give the electrical wire bundle the B-rating.

The processing unit in the present invention can temporarily give a category c, which indicates that the electrical wire or the connector does not conduct electricity to the terminal device, to all the electrical wires and connectors included in the connection information. Then, for the electrical wires to which the category a or the category b is given later, the processing unit can change the category c to the category a or the category b, and give the C-rating to the electrical wire bundle which includes only the electrical wires of the unchanged category c.

According to the device for determining an electrical wire bundle of the present invention, for both Plan 1 and Plan 2, it is possible to easily determine which wiring route is necessary for a test by the unit of an electrical wire bundle by giving the A-rating and the C-rating to the electrical wire bundles and further giving the B-rating to the electrical wire bundles on the basis of the connection relations between the electrical wires and the connectors.

BRIEF DESCRIPTION OF THE DRAWINGS

FIGS. 3A to 3E are views each showing, in the form of a table, connection information on the electrical wires and the connectors in the wiring example shown in FIG. 2 which is stored in advance in a first storage unit;

FIG. 4A is a view showing an input table in Plan 1, and FIG. 4B is a view showing an output table in Plan 1;

FIGS. 6A to 6E show the connection information table after step 1 of Plan 1 is performed;

FIGS. 10A to 10E show the connection information table after step 3 of Plan 1 is performed;

FIGS. 12A to 12E show the connection information table after step 4 of Plan 1 is performed;

FIG. 15A is a view showing an input table in Plan 2, and FIG. 15B is a view showing an output table in Plan 2;

FIGS. 16A to 16E show the connection information table after step 4 of Plan 2 is performed;

DETAILED DESCRIPTION OF THE PREFERRED EMBODIMENT

In the following, the present invention will be described on the basis of an embodiment.

A determination device 10 according to this embodiment determines and extracts the route of a certain conducting electrical wire by the unit of an electrical wire bundle from a large number of the routes of electrical wires with reference to connection information on electrical wires, connectors, etc. which is design data on a wiring system in which a plurality of harnesses are connected with one another. For example, when an electrical test is performed, the determination device 10 assists in producing a test harness correctly as well as efficiently by extracting a wiring route necessary for the test from a wiring system. Here, a harness is an assembly of connectors and an electrical wire bundle (bundle). Each electrical wire is electrically connected with a pin (or a terminal) of the connector.

Figure 1:
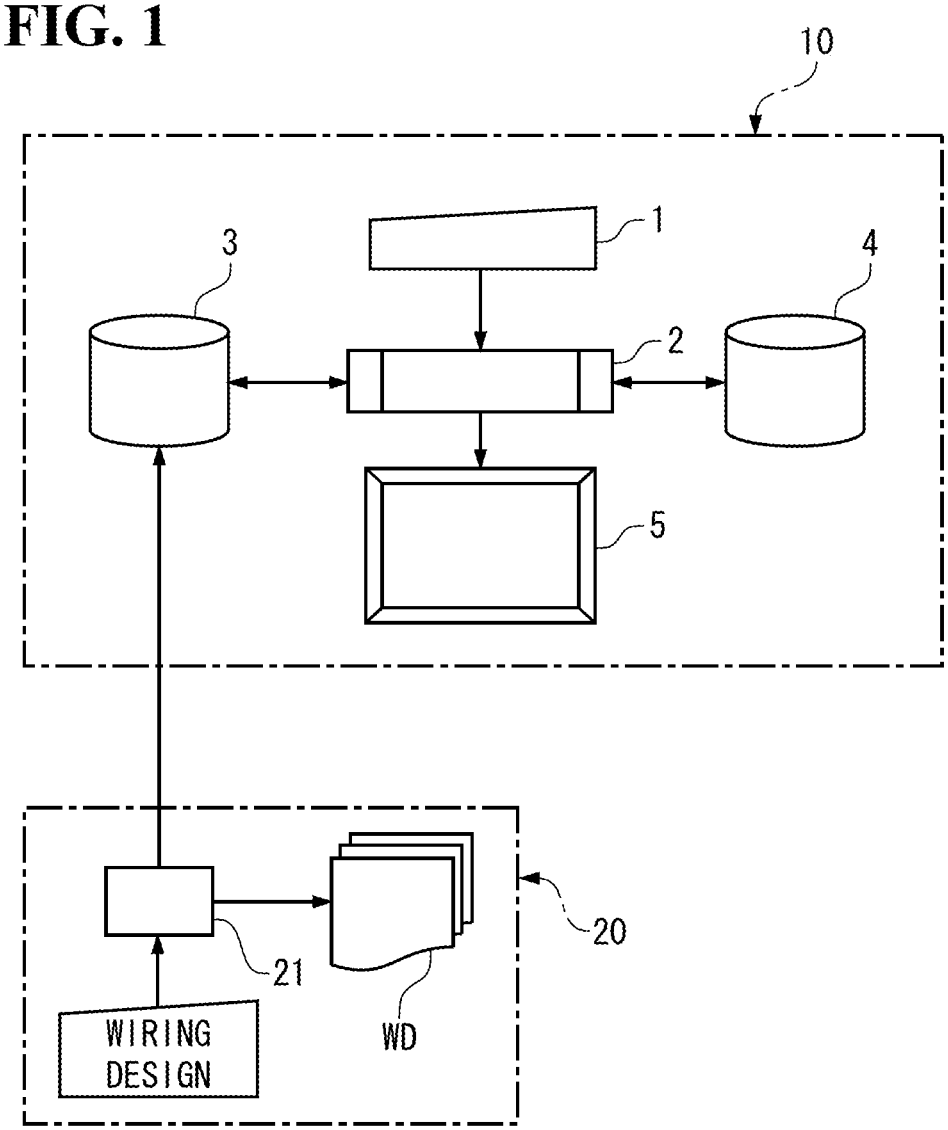
FIG. 1 is a view showing the configuration of a device for determining an electrical wire bundle in an embodiment.

As shown in FIG. 1, the determination device 10 includes an input unit 1, a processing unit 2, a first storage unit 3, a second storage unit 4, and a display unit 5. The determination device 10 can be configured by a personal computer or other computer devices.

The determination device 10 is connected with a wiring drawing system 20. The wiring drawing system 20 is also configured by a computer device.

[Outline of Determination Device 10]

The input unit 1 is a part through which commands required for the execution of the determination device 10 are input. The input unit 1 can be configured by a keyboard as the input device of a computer.

The processing unit 2 retrieves connection information and necessary connector/pin information (input table) stored in the first storage unit 3, executes steps 1 to 5 to be described later, and stores the results in the second storage unit 4 and/or display the results on the display unit 5. The information stored in the first storage unit 3 and the second storage unit 4 will be described later.

The display unit 5 displays processing results processed by the processing unit 2. The display unit 5 can be configured, for example, by a liquid crystal display device as the display device of a computer.

[Outline of Wiring Drawing System 20]

The wiring drawing system 20 includes a CAD (computer aided design) 21. The CAD 21 creates wiring diagrams (hereinafter may be referred to simply as WDs) by acquiring connection information about connectors, cables, and devices pertinent to wiring design work. WDs are diagrams showing the connection relations between electrical wires and connectors belonging to a harness. In the connection information based on a WD, harness identification information (harness ID), electrical wire identification information (electrical wire ID), and connector and pin identification information (connector ID, pin ID) are associated with one another. The CAD 21 provides the acquired connection information to the first storage unit 3 of the determination device 10. The first storage unit 3 stores the connection information provided from the CAD 21.

[Example of Wiring System]

Figure 2:
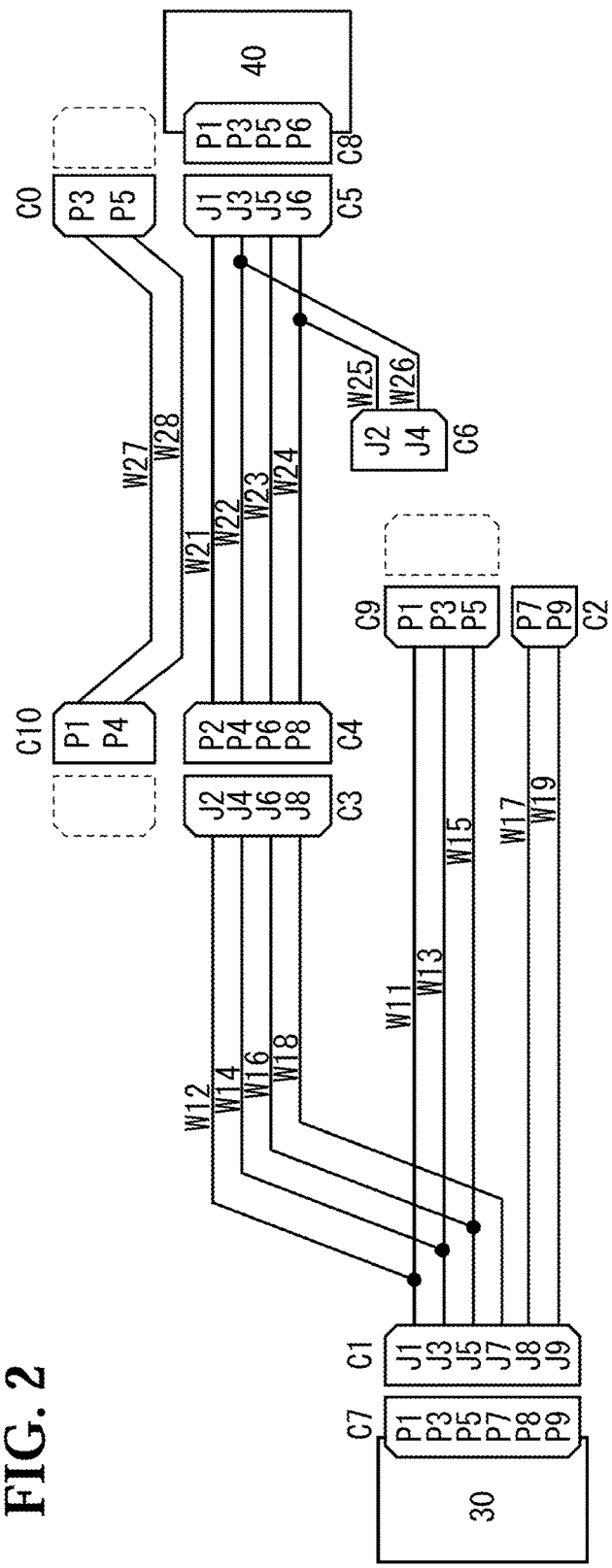
FIG. 2 is a view showing a wiring example in which electrical wires, connectors, and devices are connected with one another.

FIG. 2 shows one example of a wiring system.

The example of FIG. 2 includes two terminal devices 30, 40, with two harnesses WH1, WH2 interposed between the terminal devices 30, 40. The terminal devices 30, 40 include connectors C7, C8 which are electrically connected with connectors C1, C5 of the harnesses WH1, WH2. The terminal device 30 is a terminal device to be tested.

The harness WH1 includes a connector C1 connected with the terminal device 30, connectors C2, C9 which relay electricity to other harnesses (not shown), and a connector C3 which relays electricity to the harness WH2. The connector C1 and the connector C2 are connected with each other through electrical wires W17, W19; the connector C1 and the connector C3 are connected with each other through electrical wires W12, W14, W16, W18; and the connector C1 and the connector C9 are connected with each other through electrical wires W11, W13, W15. The electrical wires W12, W14, W16 are electrical wires branched from the electrical wires W11, W13, W15, respectively.

In the example shown here, the harness WH1 is composed of nine electrical wires for easy understanding, but in practice a larger number of electrical wires than in this example may be bundled in a harness. The reference signs WH1, WH2 mean identification symbols specifying the harnesses (harness IDs), and similarly, the reference signs W11 and so on for electrical wires mean identification symbols specifying the electrical wires (electrical wire IDs), and the reference signs C1 and so on for connectors mean identification symbols specifying the connectors (connector IDs).

Figure 18:
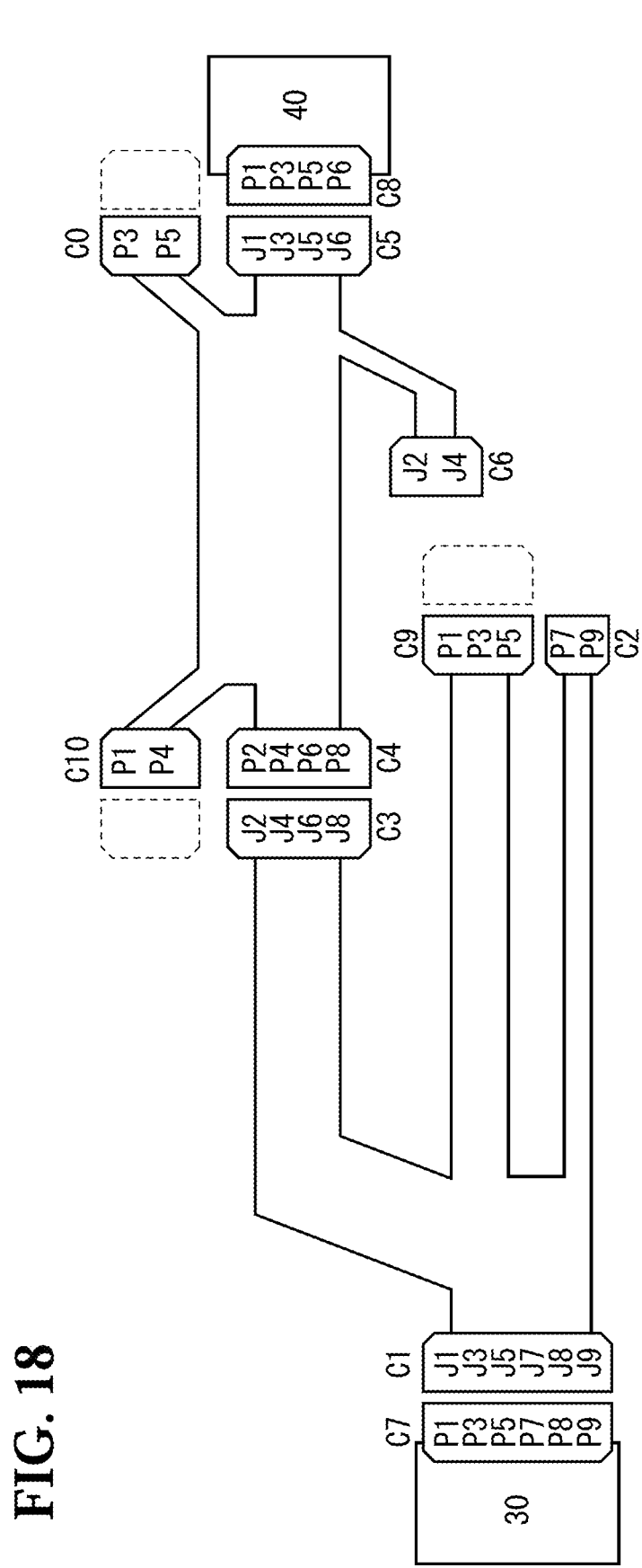
FIG. 18 is a view showing the external appearance of a harness used in the embodiment.

As has been described on the basis of FIG. 18, the connection state of the electrical wires W11 and so on included in the harnesses WH1, WH2 cannot be discerned by their appearance.

The harness WH2 includes a connector C4 connected with the connector C3 of the harness WH1, a connector C5 connected with the terminal device 40, and connectors C0, C6, C10 which relay electricity to other harnesses (not shown). The connector C4 and the connector C5 are connected with each other through electrical wires W21, W22, W23, W24; the connector C5 and the connector C6 are connected with each other through electrical wires W25, W26; and the connectors C0 and C10 are connected with each other through electrical wires W27, W28. The electrical wires W25, W26 are electrical wires branched from the electrical wires W24, W22, respectively.

FIG. 2 is used for understanding the configuration of a wiring system including a harness, and a larger system may have a combination of a large number of the configuration shown in FIG. 2.

In the harness WH1 shown in FIG. 2, the electrical wires W11, W13, W15 constitutes the same electrical wire bundle; the electrical wires W17, W19 constitute the same electrical wire bundle; and the electrical wires W12, W14, W16, W18 constitute the same electrical wire bundle. Similarly, in the harness WH2, the electrical wires W21, W22, W23, W24 constitute the same electrical wire bundle; the electrical wires W25, W26 constitute the same electrical wire bundle; and the electrical wires W27, W28 constitute the same electrical wire bundle. As can be seen with reference to FIG. 2, the unit of the electrical wire bundle is equal to the unit of one of the connectors connected with the electrical wire bundle. For example, the electrical wire bundle composed of the electrical wires W11, W13, W15 corresponds with the connector C9 with which each of the electrical wires is connected, and the electrical wire bundle composed of the electrical wires W25, W26 corresponds with the connector C6 with which each of the electrical wires is connected.

[Connection Information]

FIGS. 3A to 3D show one example of connection information stored in the first storage unit 3.

This connection information shows the connection relations between the electrical wires and the connectors belonging to the harnesses WH1, WH2 shown in FIG. 2 in association with each other. FIGS. 3A, 3B and 3C show connection information showing the correspondence relations between pins connected with each other in mating connectors in the form of a table. FIGS. 3D and 3E show connection information showing the correspondence relations between the electrical wires and the connectors connected at both ends of the electrical wires in the form of a table.

To take FIG. 3A as an example which shows the connection information on the connector C7 and the connector C1, FIG. 3A shows that the connector C7 (ITEM-1) and the connector C1 (ITEM-2) are connected with each other. Next, FIG. 3A shows that the connector C7 includes six pins specified by the pin IDs P1 to P9; that the connector C1 includes six pins specified by the pin IDs J1 to J9; and that the pins P1 to P9 and the pins J1 to J9 are connected respectively with each other.

Next, to take FIG. 3D as an example, it is shown that the electrical wires of the electrical wire IDs W12, W14, W16, W18 are connected with the connector C1 and the connector C3; that the electrical wires of the electrical wire IDs W11, W13, W15 are connected with the connector C1 and the connector C9; and that the electrical wires of the electrical wire IDs W17, W19 are connected with the connector C1 and the connector C2. It is shown that, among these electrical wires, the electrical wires of the electrical wire IDs W12, W14, W16, W18 are connected with the connector C1 through the pins of the pin IDs J1, J3, J5, J7, and connected with the connector C3 through the pins of the pin IDs J2, J4, J6, J8. Connection information on the other electrical wires is also shown in the same manner.

The connection information shown in FIGS. 3A to 3E includes, other than the information described above, a row of category and a row of overall rating (to be described later) in which information about whether or not to be used for a test is described.

[Necessary Connector/Pin Information (input table)]

FIG. 4A shows one example of an input table in which the necessary connector/pin information stored in the first storage unit 3 is written.

In the input table, the connector ID of a connector necessary for a test harness and the pin IDs of pins, among the pins of the connector, with which electrical wires necessary for the test are connected, are associated with each other.

Here, the connector is assumed to include ten pins. While all the ten pins are connected with the electrical wires in the wiring system of an actual machine, it is sometimes sufficient for a test harness that only one pin among the ten pins is connected with the electrical wire. Such information is shown in the input table, and the input table is stored in the first storage unit 3.

FIG. 4A shows that the connector C7 has the pin P1 and the pin P5 to be connected with electrical wires necessary for the test.

The input table is specified with reference to results of wiring design, i.e., WDs and WHDs, and is stored in advance in the first storage unit 3.

The following description applies to Plan 1 in which an actual harness to be energized in a sub-system test is used as it is.

[Necessary/Unnecessary Connector Information (Output Table)]

FIG. 4B shows one example of necessary/unnecessary connector information (hereinafter "output table") stored in the second storage unit 4.

The output table shows results of determination processing in this embodiment which will be described next, and the output table is stored in the second storage unit 4, with the connectors belonging to the same harness ID classified into "necessary connectors" and "unnecessary connectors", and the unnecessary connectors further classified into "conducting" and "non-conducting". This output table can be displayed on the display unit 5.

Here, a necessary connector refers to a connector which conducts electricity by being connected through the electrical wire and the pin corresponding with the pin ID listed in the input table and which is used for the test. The connectors listed in the input table are also necessary connectors.

An unnecessary (conducting) connector refers to a connector which conducts electricity to the connector listed in the input table but conducts electricity through a pin different from the pin ID listed in the input table, and which is not used for the test.

An unnecessary (non-conducting) connector refers to a connector which conducts electricity to none of the connectors and the pins listed in the input table.

In the example of the output table shown in FIG. 4B, it is shown as information in the form of a table that, for the harness WH1, the connectors C1, C3, C9 are necessary connectors; that the connector C2 is an unnecessary (conducting) connector; and that the harness WH1 includes no unnecessary (non-conducting) connector. Information on the harness WH2 is shown in the same manner.

[Determination Procedure]

Next, an electrical wire bundle determination procedure in this embodiment will be described with reference to FIG. 5 to FIG. 13. The wiring diagram shown in FIG. 2 and the connection information shown in FIGS. 3A to 3E show an initial state in the procedure, and from this initial state step 1 to step 5 to be described below are sequentially executed.

<Step 1 (FIG. 5, FIGS. 6A to 6E)>

In step 1, a category "c" among categories "a", "b", "c" is temporarily given to all the connectors and electrical wires in the connection information table. The details of the categories a, b, c are described below.

Figure 5:
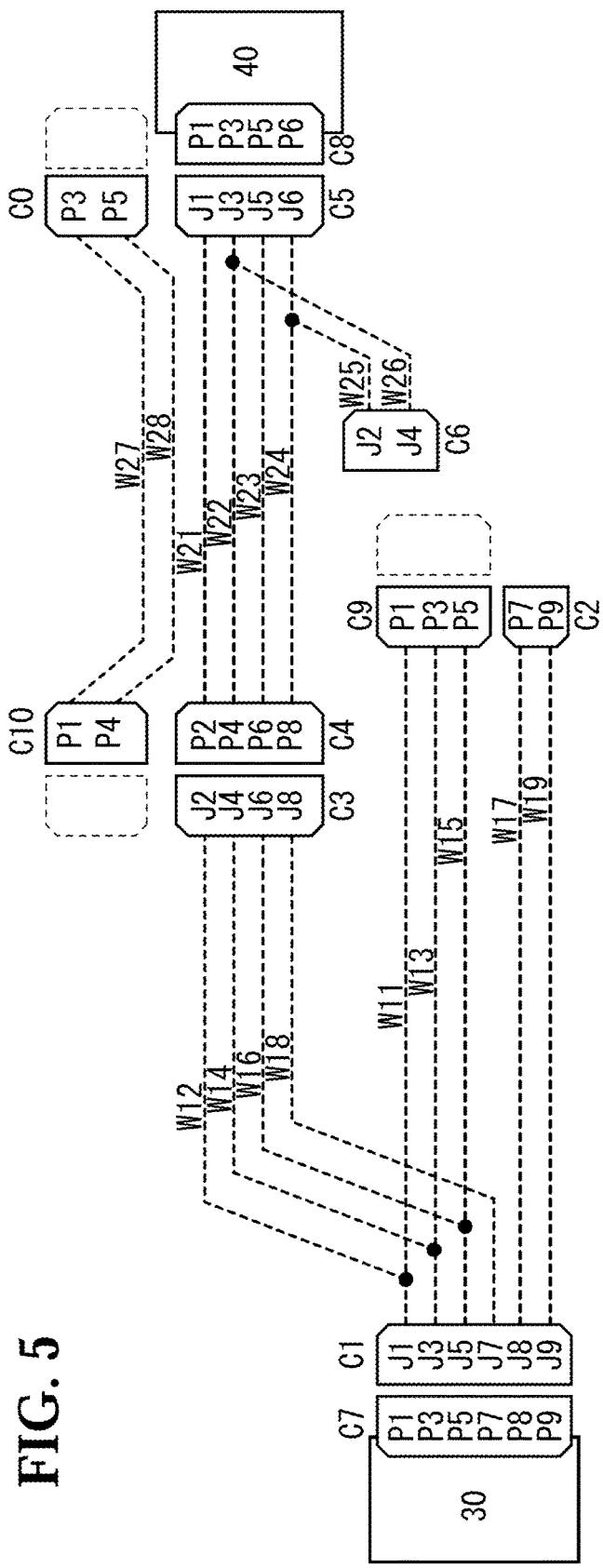
FIG. 5 shows the wiring diagram after step 1 of Plan 1 is performed.

Thus, all the electrical wires W11 to W28 in the wiring diagram shown in FIG. 5 are indicated by dashed lines which correspond with the category c, and c is given to all the cells of the row of category in the connection information table shown in FIGS. 6A to 6E. At this point, the row of overall rating is blank.

In the wiring diagrams shown in FIG. 3A and the subsequent drawings, the categories a, b, c are indicated by solid lines, dot-and-dash lines, and dashed lines, respectively.

Category a: Electrical wires which conduct electricity to the terminal device 30 and are to be used for the test (solid lines)

Category b: Electrical wires which conduct electricity to the terminal device 30 but are not to be used for the test (dot-and-dash lines)

Category c: Electrical wires which do not conduct electricity to the terminal device 30 and are not to be used for the test (dashed lines)

<Step 2 (FIG. 7, FIGS. 8A to 8E)>

In step 2, first, the connector IDs and the pin IDs written in the input table are linked to the connection information on the harness. The results of this linking are as shown in FIGS. 8A to 8E, in which those connector IDs and pin IDs which are the same as the connector IDs and the pin IDs written in the input table and which are written in the connection information table are connected with those on the input table by arrows, while the applicable cells are shaded. For example, for the pin P1 written in the input table, the pin P1 of the connector C7 and the pin J1 of the connector C1 are linked to each other in the connection information table of FIG. 8A. Moreover, the pin J1 of the connector C1, the electrical wire W12 connected with the pin J1, and the pin J2 of the connector C3 connected with the electrical wire W12 are linked to one another in FIG. 8D.

Next, the categories of the linked connectors and electrical wires are changed from c (not to be used) to a (to be used).

Figure 7:
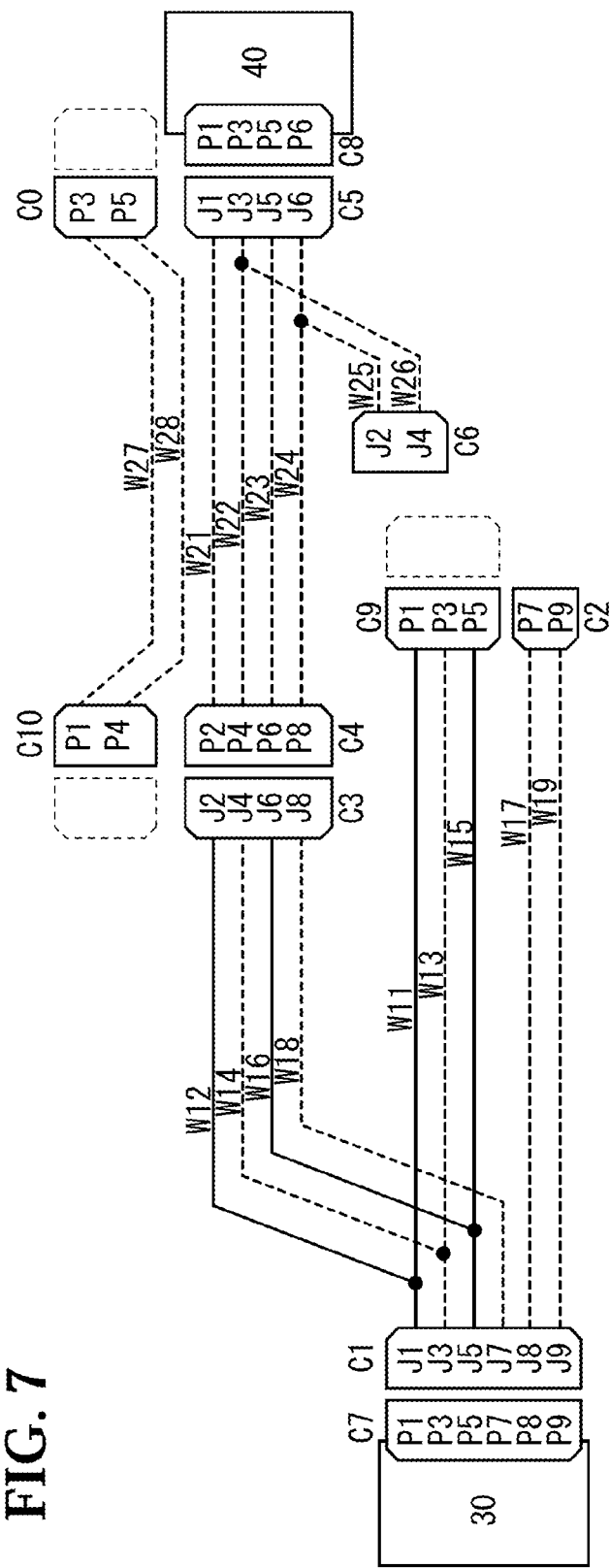
FIG. 7 shows the wiring diagram after step 2 of Plan 1 is performed.
Figure 8:
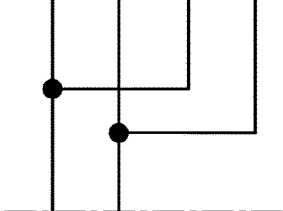
FIGS. 8A to 8E show the connection information table after step 2 of Plan 1 is performed.

This change is represented by the electrical wires W11, W12, W15, W16 being indicated by the solid lines in FIG. 7, the categories of the linked pin J1 and pin J5 having become "a" in FIG. 8A, and the categories of the electrical wires W11, W12, W15, W16 having become "a" in FIG. 8D.

Next, an overall rating is given on the basis of the given categories.

This overall rating is given on the basis of the following criteria.

That is, if there are electrical wires of different categories within the same harness, the electrical wire bundles can be classified into the categories A, B, C shown below.

Then, when the order of priority of the categories for the electrical wires is a>b>c, the overall rating of the connector represents the category of higher priority of the electrical wires by a capital letter.

A: Electrical wire bundle to be used for the test if it includes even one electrical wire which conducts electricity to the terminal device 30 and is to be used for the test.

B: Electrical wire bundle which is not allowed to be physically disconnected at the root of the branch line, if it includes at least one electrical wire which conducts electricity to the terminal device 30 but is not to be used for the test, since the electrical wire conducts electricity to the terminal device 30 to be tested.

C: Electrical wire bundle which can be disconnected at the root of the branch if none of the electrical wires conducts electricity to the terminal device 30 and is to be used for the test.

As a specific example of the overall rating, in FIG. 8A, the connector C1, which includes the category "a", is given the overall rating "A". Similarly, in FIG. 8D, the categories of the electrical wires W12, W16 connected with the connector C3 are "a", and the categories of the electrical wires W11, W15 connected with the connector C9 are "a", so that the overall rating is "A".

<Step 3 (FIG. 9, FIGS. 10A to 10E)>

Next, the categories of the pin IDs which are not designated in the input table among the pins of the connector C1 connected with the terminal device 30 and the categories of the electrical wires of the harness WH1 connected with these undesignated pins are changed from the category "c" to the category "b (electrical wires which conduct electricity to the terminal device 30 but are not to be used for the test)".

Figure 9:
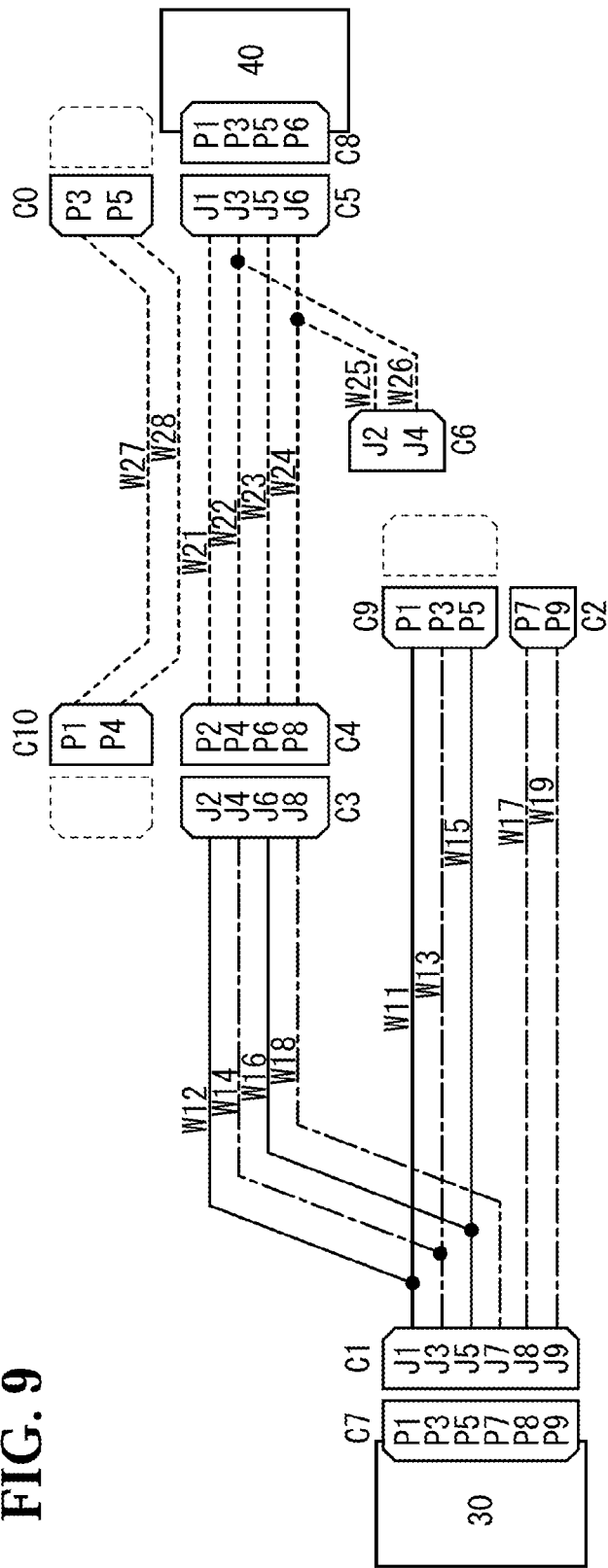
FIG. 9 shows the wiring diagram after step 3 of Plan 1 is performed.
Figures 10D, 10E:
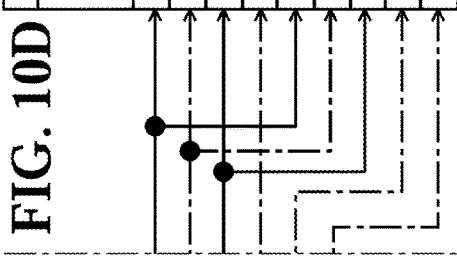

This change is represented by the electrical wires W14, W18, W13, W17, W19 of FIG. 9 being indicated by the dot-and-dash lines, the categories of the pins J3, J7, J8, J9 of FIG. 10A being indicated by "b"; and the categories of the electrical wires W14, W18, W13, W17, W19 of FIG. 10D being indicated by "b".

Thereafter, the highest category of the electrical wires of the harness WH1 is regarded as the overall rating of the connector connected with the electrical wires. This is represented by the overall rating of the connector C2 of FIG. 10D being "B" in correspondence with the category "b" of the electrical wires W17, W19.

<Step 4 (FIG. 11, FIGS. 12A to 12D)>

In step 4, step 2 and step 3 are further performed on the harness WH2.

That is, in step 2, pieces of identification information are linked to one another in the order of FIGS. 12D, 12B, 12E, 12C as indicated by the arrows and the shading. In FIG. 12B, the categories of the connector C4 have been changed from "c" to "a" or "b"; in FIG. 12E, the categories of the electrical wires W21, W22, W23, W24, W25, W26 have been changed from "c" to "a" or "b"; and in FIG. 12C, the categories of the connector C8 have been changed from "c" to "a" or "b".

As step 3, in FIG. 12B, the overall rating "A" is given to the connector C4, and in FIG. 12E, the overall ratings "C", "A", "B" are given to the connectors C0, C5, C6, respectively.

Figure 11:
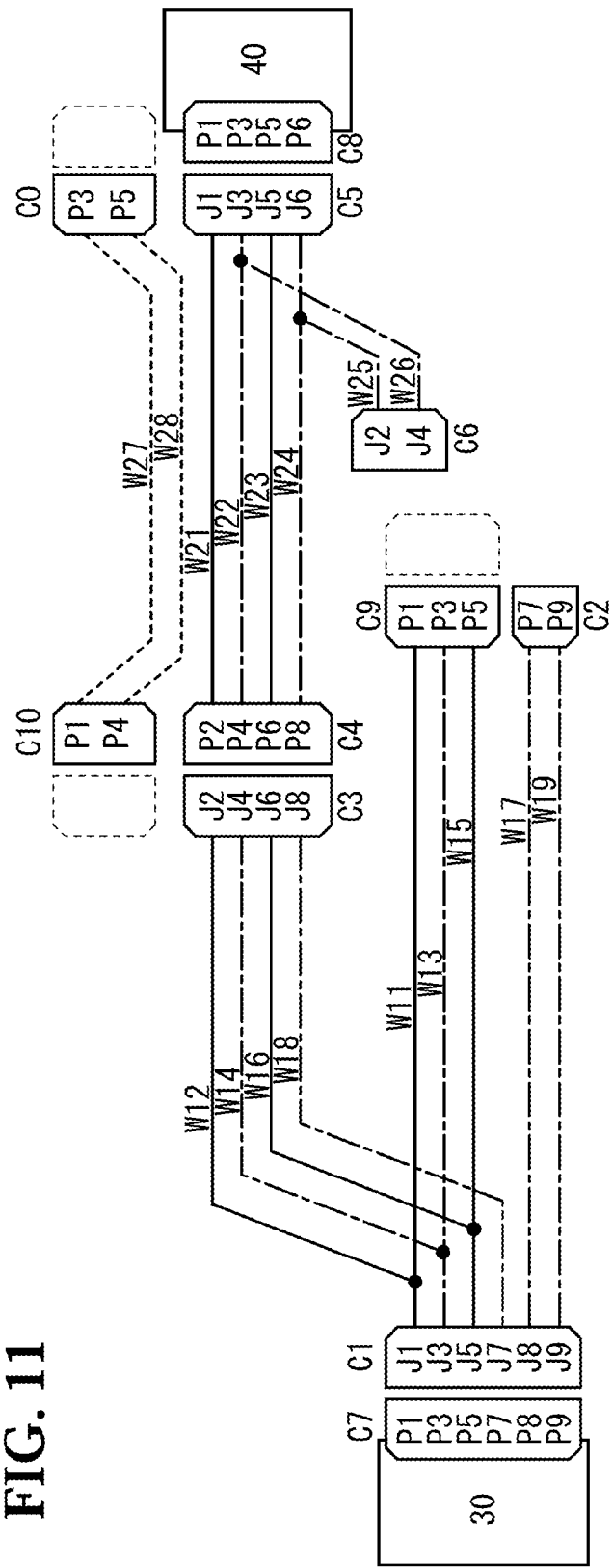
FIG. 11 shows the wiring diagram after step 4 of Plan 1 is performed.

The line types of the electrical wires in the wiring example shown in FIG. 11 reflect these category changes.

As a result, a test harness connected with the connector can be processed according to the overall rating as follows:

Overall rating A: The harness will not be processed at all since it includes an electrical wire to be used for the test.

Overall rating B: The harness includes an electrical wire which is unnecessary for the test, but the electrical wire is conducting electricity to the terminal device 30 to be tested and cannot be disconnected at an intermediate point. Therefore, a conductive cap will be put on the terminal end of the connector.

Overall rating C: Since none of the electrical wires is necessary for the test and conducts electricity to the terminal device 30 to be tested, the harness can be disconnected at the branch root of the cable including the connector.

<Step 5 (FIG. 13)>

As shown in FIG. 4B, the overall ratings of the connectors connected with each wire harness are summarized in the output table.

Being merely the summarization result of the ratings obtained, the output table only shows whether or not the connectors (and the accompanying cables) are necessary for the test; whether or not each electrical wire is necessary is based on the results described in the connection information table obtained by step 1 to step 4.

Figure 13:
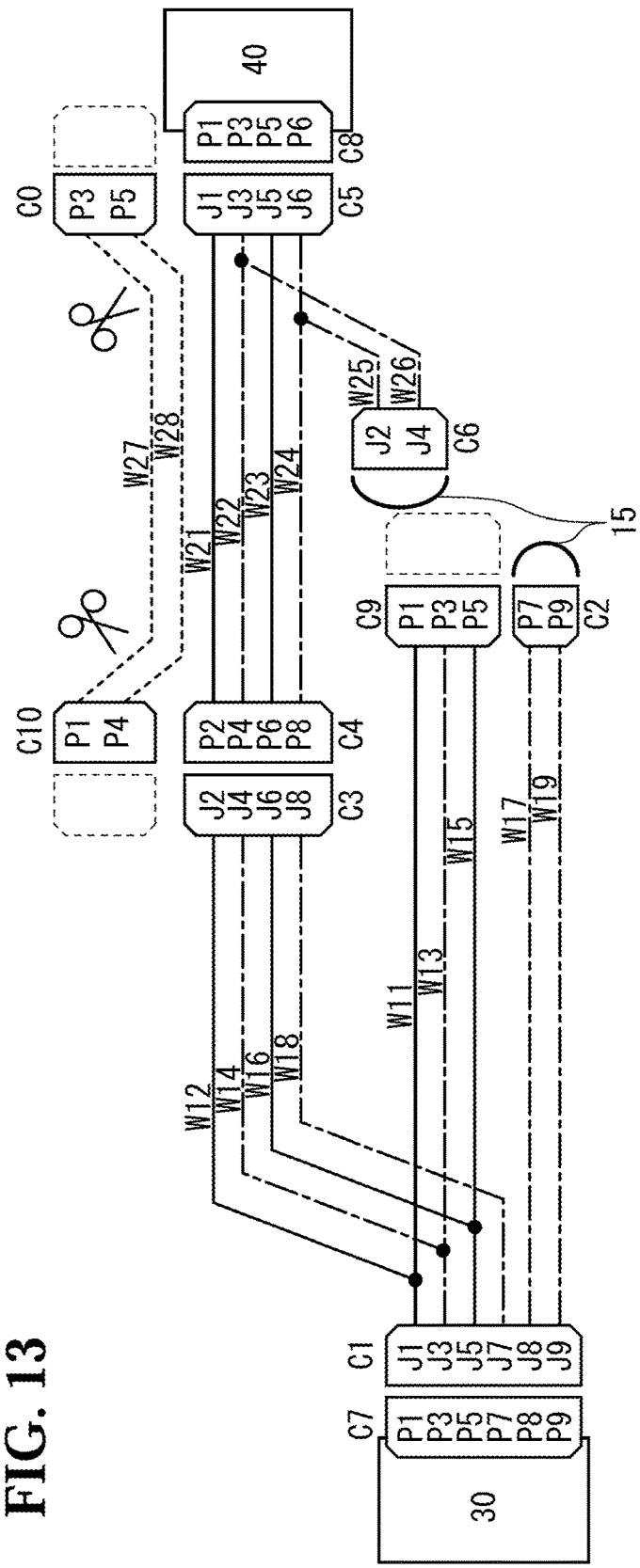
FIG. 13 shows the wiring diagram after step 5 of Plan 1 is performed.

In FIG. 13, the electrical wires W27, W28 connected with the connectors C10, C0 of which the overall ratings are C are disconnected, while conductive caps 15 are put on the connectors C2, C6 of which the overall ratings are B.

The results thus obtained by the determination device 10 can be displayed on the display unit 5. The contents of display can be any one or all of the connection information shown in FIGS. 12A to 12E, the wiring diagram shown in FIG. 13, and the output table shown in FIG. 4B.

[Effects]

As has been described above, according to the determination device 10, it is possible to easily determine which wiring route is necessary for the test by the unit of an electrical wire bundle, as well as to display the determination results with a clear distinction between the electrical wire bundles necessary for the test and the electrical wire bundles unnecessary for the test.

Moreover, according to the determination device 10, even when the wiring design is changed, it is possible to easily extract the electrical wire bundle, which includes a wiring route necessary for the test, after the design change as well by rewriting the connection information and the input table according to this change, and to display the extraction results with a visual and clear distinction between the electrical wire bundles necessary for the test and the electrical wire bundles unnecessary for the test.

Next, an example which accommodates Plan 2 will be described in which an actual harness to be energized in a sub-system test is redesigned into a harness in which only those electrical wires that are to be energized in the test are left while all the unnecessary electrical wires are removed.

The wiring example shown in FIG. 2, the connection information shown in FIGS. 3A to 3E, and the input table (shown again in FIG. 15A) are the same as those of Plan 1, and differences from Plan 1 will be mainly described below.

Figure 14:
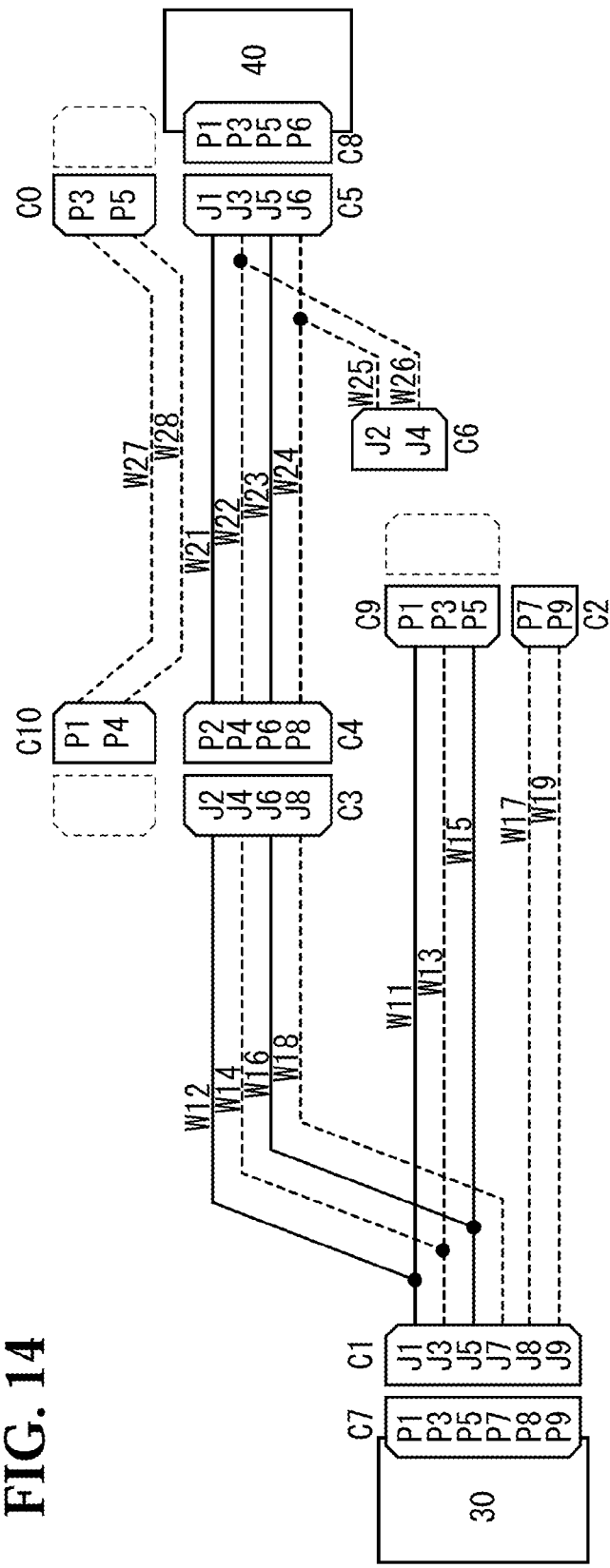
FIG. 14 shows the wiring diagram after step 4 of Plan 2 is performed.
Figure 16D:
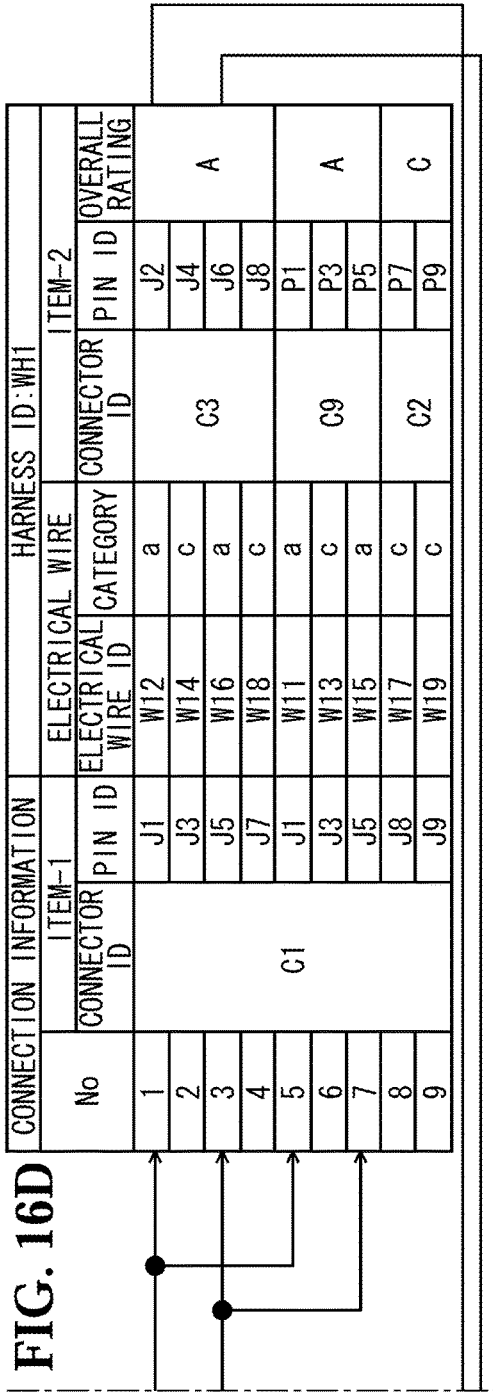
Figure 16E:
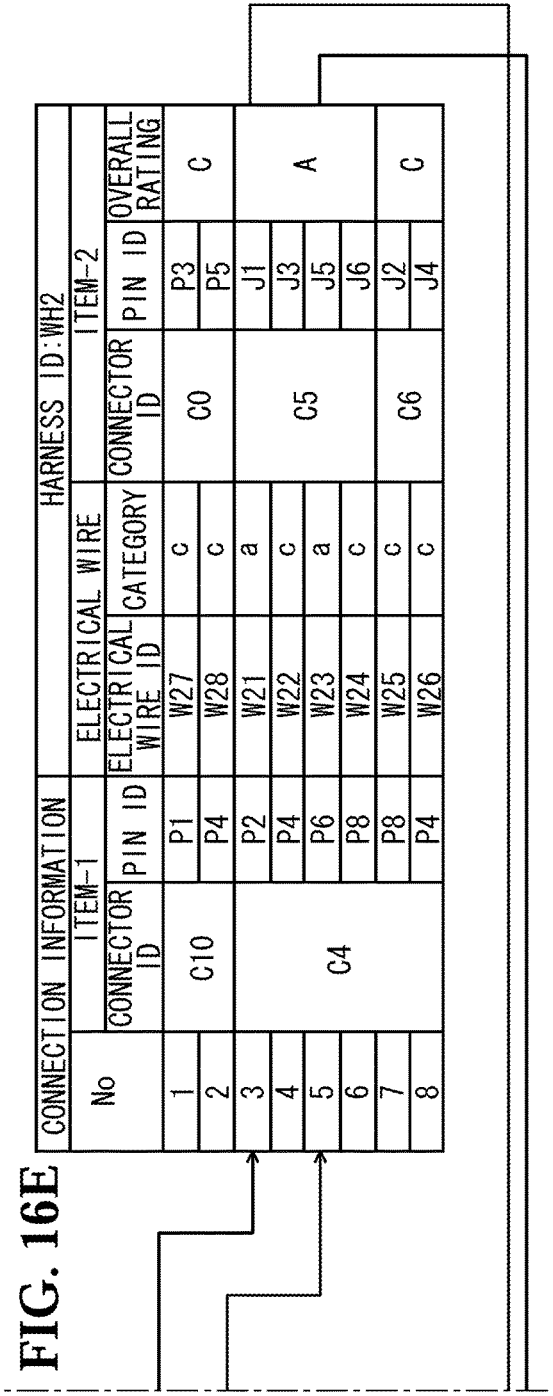

In Plan 2, in which a test harness is newly produced, electrical wires unnecessary for the test are not connected to the connector 7 of the terminal device 30 to be tested. Thus, since step 3 is performed without going through step 2 described for Plan 1, the categories of the connectors and the electrical wires are "a" or "c", and the overall ratings of the harnesses are "A" or "C". As a result, as shown in FIG. 14, in the wiring diagram, the electrical wires are indicated by either the solid lines corresponding with the category "a" or the dashed lines corresponding with the category "c". As shown in FIGS. 16A to 16E, in the connection information table, the categories are indicated by either "a" or "c", and the overall ratings are indicated by either "A" or "C".

Figure 17:
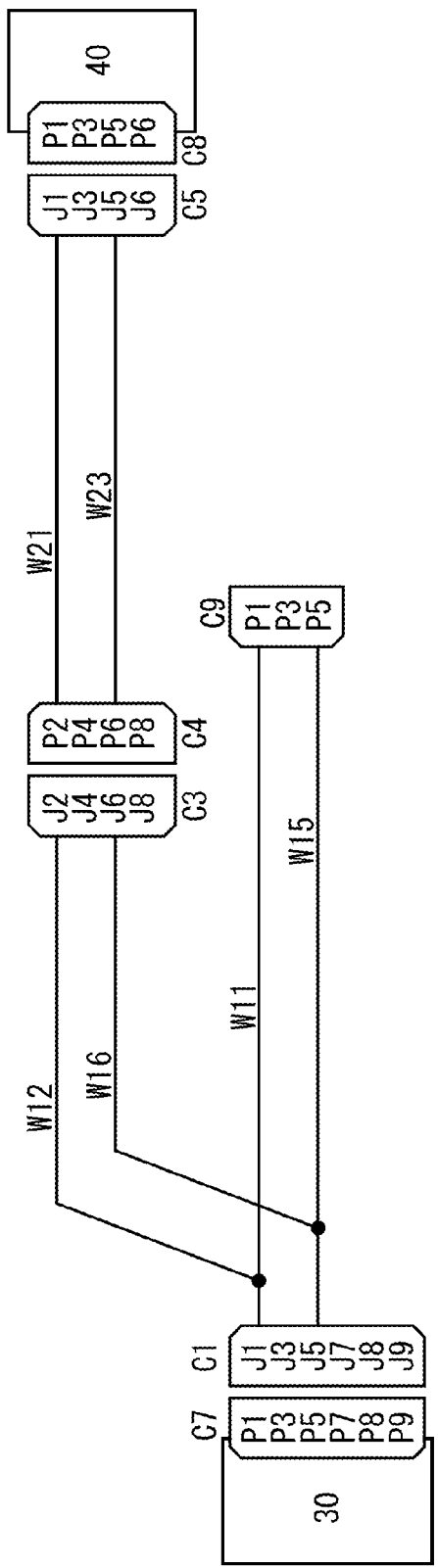
FIG. 17 is a view showing a final form of the wiring diagram in Plan 2.

As a result, as shown in FIG. 17, the wiring diagram to be newly produced shows only the electrical wires to be energized in the test, i.e., the electrical wires W12, W16, W11, W15, W21, W23 indicated by the solid lines in FIG. 14, the connectors connected with these electrical wires, and the terminal devices 30, 40. As shown in FIG. 16B, in the output table, the connectors are classified into necessary connectors and unnecessary (non-conducting) connectors.

As has been described above, it is possible to create and display a wiring diagram and an output table suitable for Plan 2, in which a test harness is newly produced, by narrowing down each of the categories and the overall ratings to two types.

When Plan 2 and Plan 1 are compared with each other, Plan 1 is preferable in that the actual machine is strictly simulated, since in Plan 2 a lightning protection current applied to necessary electrical wires is larger for the number of the other unnecessary (conducting) electrical wires which are of the category b and thus eliminated. Accordingly, compared with Plan 2, Plan 1 requires more test materials and more test time and effort.

While the present invention has been described on the basis of the preferred embodiment, the configurations presented in the above embodiment can be selectively adopted or appropriately modified into other configurations within the scope of the present invention.

For easy understanding, the connection information table shown as divided into FIGS. 3A to 3E. However, the form of the connection information table is not limited to that shown in FIGS. 3A to 3E as long as necessary links can be made and the categories and the overall ratings can be given.

In the embodiment of Plan 1, for example, after the category c is temporarily given, some of the categories are changed to a and then others are changed to b, but this procedure may be changed as long as the final classification into the categories a, b, c can be made.

In the embodiment of the present invention, only one connector (connector ID C7) necessary for a test harness is registered in the input table (FIG. 4A) for easy understanding. In practice, however, a plurality of connectors are required in most cases, and, of course, pin information (pin IDs) corresponding with a plurality of connectors can be registered in the input table.

In that case, it goes without saying that even when electrical wires are classified into the categories a, b, c from the information on one connector and the pins of the connector as described above, if information on another connector and the pins of that connector is added, the electrical wires which have been classified into the categories b and c may be reclassified into the category a, and the category a or b, respectively.

Moreover, even when pieces of information on the plurality of pins registered in the input table turn out to be linked to one another (i.e., even when pieces of the connection information overlap), the results to be obtained are the same, and therefore it is not necessary to take into account whether there is any overlap when creating the input table.

Furthermore, the determination device 10 is preferably used for designing, testing, building and/or producing a large wiring system, wiring structure, wire route, which is for example mounted on an aircraft. The device 10 is also preferably used for designing, testing and/or producing a large number of wire harnesses partly constituting the wiring system, wiring structure, and/or wiring route, which are for example mounted an aircraft.

What is claimed is:

1. A system for producing and determining an electrical wire bundle that includes a test electrical wire to be used for an electrical test in a wiring structure interconnecting terminal devices through a plurality of wire harnesses each including a plurality of electrical wires composing an electrical wire bundle and connectors connected with the electrical wires, the device comprising:
   a storage unit which stores connection information about connection relations between the electrical wires and the connectors; and
   a processing unit which determines which electrical wire bundle includes the test electrical wire on the basis of the connection information stored in the storage unit, wherein,
   the processing unit is configured to assign an A-rating to the electric wire bundle when the electrical wire bundle includes even one test electrical wire which conducts electricity to the terminal device,
   the processing unit is configured to assign a C-rating to the electric wire bundle when the electrical wire bundle includes only the electrical wires that do not conduct electricity to the terminal device, and
   the system is configured to produce a test wire harness including only the electric wire bundles having the A-rating, among the electric wire bundles having one of the A-rating and C-rating.

2. The system for producing and determining an electrical wire bundle according to claim 1, wherein:
   when the electrical wire bundle includes at least one electrical wire which conducts electricity to the terminal device but is not the test electrical wire, the processing unit assigns the electrical wire bundle a B-rating, and
   the produced test wire harness further includes electrical wire bundles having the B-rating.

3. The system for producing and determining an electrical wire bundle according to claim 1, wherein:
   on the basis of identification information on pins of a test connector included in the terminal device used for the test, the processing unit is further configured to link pieces of the connection information stored in the storage unit to one another, and assign each of the linked electrical wires a category 'a' that indicates that the electrical wire is the test electrical wire, and
   when the electrical wire bundle includes even one test electrical wire to which the category 'a' is assigned, the processing unit is further configured to assign the electrical wire bundle the A-rating.

4. The system for producing and determining an electrical wire bundle according to claim 2, wherein:
   on the basis of identification information on pins of a test connector included in the terminal device used for the test, the processing unit is further configured to link pieces of the connection information stored in the storage unit to one another, and assign each of the linked electrical wires a category 'a' that indicates that the electrical wire is the test electrical wire, and
   when the electrical wire bundle includes even one test electrical wire to which the category 'a' is assigned, the processing unit is further configured to assign the electrical wire bundle the A-rating.

5. The system for producing and determining an electrical wire bundle according to claim 3, wherein:
   on the basis of identification information on pins which are pins of a connector mated with the terminal device used for the test and other than the pins of the test connector, the processing unit is further configured to link pieces of the connection information stored in the storage unit to one another, and assign each of the linked electrical wires a category 'b' that indicates that the electrical wire conducts electricity to the terminal device but is not the test electrical wire, and
   when the electrical wire bundle includes no electrical wires to which the category 'a' is assigned but includes the electrical wire to which the category 'b' is assigned, the processing unit is further configured to assign the electrical wire bundle the B-rating.

6. The system for producing and determining an electrical wire bundle according to claim 4, wherein:
   on the basis of identification information on pins which are pins of a connector mated with the terminal device used for the test and other than the pins of the test connector, the processing unit is further configured to link pieces of the connection information stored in the storage unit to one another, and assign each of the linked electrical wires a category 'b' that indicates that the electrical wire conducts electricity to the terminal device but is not the test electrical wire, and
   when the electrical wire bundle includes no electrical wires to which the category 'a' is given but includes the electrical wire to which the category 'b' is given, the processing unit is further configured to assign the electrical wire bundle the B-rating.

7. The system for producing and determining an electrical wire bundle according to claim 5, wherein:
the processing unit is further configured to temporarily assign a category 'c', which indicates that the electrical wire or the connector does not conduct electricity to the terminal device, to all the electrical wires and connectors included in the connection information, and
for the electrical wires to which the category 'a' or the category 'b' is assigned, the processing unit is further configured to change the category 'c' to the category 'a' or the category 'b', and assign the C-rating to the electrical wire bundle that includes only the electrical wires of the unchanged category 'c'.

8. The system for producing and determining an electrical wire bundle according to claim 6, wherein:
the processing unit is further configured to temporarily assign a category 'c', which indicates that the electrical wire or the connector does not conduct electricity to the terminal device, to all the electrical wires and connectors included in the connection information, and
for the electrical wires to which the category 'a' or the category 'b' is assigned, the processing unit is further configured to change the category 'c' to the category 'a' or the category 'b', and assign the C-rating to the electrical wire bundle that includes only the electrical wires of the unchanged category 'c'.

9. A method for producing and determining an electrical wire bundle that includes a test electrical wire to be used for an electrical test in a wiring structure interconnecting terminal devices through a plurality of wire harnesses each including a plurality of electrical wires composing an electrical wire bundle and connectors connected with the electrical wires, the method comprising steps of using the device according to claim 1 to perform:
storing connection information about connection relations between the electrical wires and the connectors;
determining which electrical wire bundle includes the test electrical wire on the basis of the connection information stored in the storage unit, wherein the determining step comprises:
assigning an A-rating to the electric wire bundle when the electrical wire bundle includes even one test electrical wire which conducts electricity to the terminal device; and
assigning a C-rating to the electric wire bundle when the electrical wire bundle includes only the electrical wires that do not conduct electricity to the terminal device; and
producing a test wire harness including only the electric wire bundles having the A-rating, among the electric wire bundles having one of the A-rating and C-rating.

10. The method for producing and determining an electrical wire bundle according to claim 9, wherein:
the determining step further comprises assigning a B-rating to the electric wire bundle when the electrical wire bundle includes at least one electrical wire which conducts electricity to the terminal device but is not the test electrical wire, and
the produced test wire harness further includes electrical wire bundles having the B-rating.

11. The method for producing and determining an electrical wire bundle according to claim 9, wherein:
on the basis of identification information on pins of a test connector included in the terminal device used for the test, the method further comprises linking pieces of the stored connection information to one another, and assigning each of the linked electrical wires a category 'a' indicating that the electrical wire is the test electrical wire, and
when the electrical wire bundle includes even one test electrical wire to which the category 'a' is given, assigning the electrical wire bundle the A-rating.

12. The method for producing and determining an electrical wire bundle according to claim 10, wherein:
on the basis of identification information on pins of a test connector included in the terminal device used for the test, the method further comprises linking pieces of the stored connection information to one another, and assigning each of the linked electrical wires a category 'a' indicating that the electrical wire is the test electrical wire, and
when the electrical wire bundle includes even one test electrical wire to which the category 'a' is assigned, assigning the electrical wire bundle the A-rating.

13. The method for producing and determining an electrical wire bundle according to claim 11, wherein:
on the basis of identification information on pins which are pins of a connector mated with the terminal device used for the test and other than the pins of the test connector, the method further comprises linking pieces of the stored connection information to one another, and assigning each of the linked electrical wires a category 'b' indicating that the electrical wire conducts electricity to the terminal device but is not the test electrical wire, and
when the electrical wire bundle includes no electrical wires to which the category 'a' is assigned but includes the electrical wire to which the category 'b' is assigned, assigning the electrical wire bundle the B-rating.

14. The method for producing and determining an electrical wire bundle according to claim 12, wherein:
on the basis of identification information on pins which are pins of a connector mated with the terminal device used for the test and other than the pins of the test connector, the method further comprises linking pieces of the stored connection information to one another, and assigning each of the linked electrical wires a category 'b' indicating that the electrical wire conducts electricity to the terminal device but is not the test electrical wire, and
when the electrical wire bundle includes no electrical wires to which the category 'a' is assigned but includes the electrical wire to which the category 'b' is assigned, assigning the electrical wire bundle the B-rating.

15. The method for producing and determining an electrical wire bundle according to claim 13, further comprising:
temporarily assigning a category 'c', which indicates that the electrical wire or the connector does not conduct electricity to the terminal device, to all the electrical wires and connectors included in the connection information, and
for the electrical wires to which the category 'a' or the category 'b' is assigned, changing the category 'c' to the category 'a' or the category 'b', and assigning the C-rating to the electrical wire bundle that includes only the electrical wires of the unchanged category 'c'.

16. The method for producing and determining an electrical wire bundle according to claim 14, further comprising:
temporarily assigning a category 'c', which indicates that the electrical wire or the connector does not conduct electricity to the terminal device, to all the electrical wires and connectors included in the connection information, and for the electrical wires to which the category 'a' or the category 'b' is assigned, changing the category 'c' to the category 'a' or the category 'b', and assigning the C-rating to the electrical wire bundle which includes only the electrical wires of the unchanged category 'c'.

17. A system for determining an electrical wire bundle that includes a test electrical wire to be used for an electrical test in a wiring structure interconnecting terminal devices through a plurality of wire harnesses each including a plurality of electrical wires composing an electrical wire bundle and connectors connected with the electrical wires, the system comprising:
- a storage unit which stores connection information about connection relations between the electrical wires and the connectors; and
- a processing unit which determines which electrical wire bundle includes the test electrical wire on the basis of the connection information stored in the storage unit, wherein:
- the processing unit is configured to assign an A-rating to the electric wire bundle when the electrical wire bundle includes even one test electrical wire which conducts electricity to the terminal device; and
- the processing unit is configured to assign a C-rating to the electric wire bundle when the electrical wire bundle includes only the electrical wires that do not conduct electricity to the terminal device, and
- the electrical wire included in the electrical wire bundle having the C-rating is disconnected, among the electric wire bundles having one of the A-rating and C-rating.

18. The system for determining an electrical wire bundle according to claim 17, wherein:
- when the electrical wire bundle includes at least one electrical wire which conducts electricity to the terminal device but is not the test electrical wire, the processing unit assigns the electrical wire bundle a B-rating, and
- a conductive body is put on a terminal end of the connector connected to the electrical wire included in the electrical wire bundle having the B-rating.

19. A method of using the system according to claim 17 for determining an electrical wire bundle that includes a test electrical wire to be used for an electrical test in a wiring structure interconnecting terminal devices through a plurality of wire harnesses each including a plurality of electrical wires composing an electrical wire bundle and connectors connected with the electrical wires, the method comprising:
- storing connection information about connection relations between the electrical wires and the connectors;
- determining which electrical wire bundle includes the test electrical wire on the basis of the connection information stored in the storage unit, wherein the determining step comprises:
  - assigning an A-rating to the electric wire bundle when the electrical wire bundle includes even one test electrical wire which conducts electricity to the terminal device; and
  - assigning a C-rating to the electric wire bundle when the electrical wire bundle includes only the electrical wires that do not conduct electricity to the terminal device; and
- disconnecting the electrical wires included in the electrical wire bundle having the C-rating, among the electric wire bundles having one of the A-rating and C-rating.

20. The method for determining an electrical wire bundle according to claim 19, wherein:
- the determining step further comprises assigning a B-rating to the electric wire bundle when the electrical wire bundle includes at least one electrical wire which conducts electricity to the terminal device but is not the test electrical wire, and
- the method further comprises a step of putting a conductive body on a terminal end of the connector connected to the electrical wire included in the electrical wire bundle having the B-rating.

* * * * *